United States Patent
Seh et al.

(10) Patent No.: US 7,435,675 B2
(45) Date of Patent: Oct. 14, 2008

(54) METHOD OF PROVIDING A PRE-PATTERNED HIGH-K DIELECTRIC FILM

(75) Inventors: Huankiat Seh, Phoenix, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/479,400

(22) Filed: Jun. 30, 2006

(65) Prior Publication Data

US 2008/0003764 A1    Jan. 3, 2008

(51) Int. Cl.
H01L 21/4763    (2006.01)

(52) U.S. Cl. .................. 438/623; 438/637; 438/780; 257/E21.17; 257/E21.229; 257/E21.311; 257/E21.347; 257/E21.397

(58) Field of Classification Search .......... 438/637, 438/270, 238, 381, 513, 475, 678, 706, 745, 438/463, 623, 734, 780
See application file for complete search history.

(56) References Cited

U.S. PATENT DOCUMENTS

| | | | | |
|---|---|---|---|---|
| 5,481,490 | A * | 1/1996 | Watanabe et al. | 365/145 |
| 5,767,564 | A * | 6/1998 | Kunimatsu et al. | 257/532 |
| 6,060,735 | A * | 5/2000 | Izuha et al. | 257/295 |
| 2006/0289976 | A1* | 12/2006 | Min | 257/678 |
| 2007/0202655 | A1* | 8/2007 | Min | 438/381 |

OTHER PUBLICATIONS http://www.wtec.org/loyola/nano/US.Review/04 02.htm, 1998.
http://en.wikipedia.org/wiki/Soft lithography, 2006.
Yongki, Min et al., U.S. Appl. No. 11/092,357, entitled "Capacitor with Co-planar Electrodes", filed Mar. 29, 2005.
Yongki, Min et al., U.S. Appl. No. 10/882,745, entitled "Metal Oxide Ceramic Thin Film on Base Metal Electrode", filed Jun. 30, 2004.
Palanduz, Cengiz A. et al., U.S. Appl. No. 10/976,425, entitled "Redox Control of Adhesion Layer of Thin Film Capacitor", filed Oct. 29, 2004.
Palanduz, Cengiz A. et al., U.S. Appl. No. 10/971,829, entitled "Passive Device Structure", filed Oct. 21, 2004.
Yongki, Min, U.S. Appl. No. 10/974,139, entitled "Thin Film Capacitor", filed Oct. 26, 2004.
Yongki, Min et al., U.S. Appl. No. 11/095,690, entitled "IC Package with Prefabricated Film Capacitor", filed Mar. 31, 2005.
Min, Yongki, U.S. Appl. No. 11/152,328, entitled "Integrated thin-film capacitor with etch-stop layer, process of making same, and packages containing same", filed Jun. 14, 2005.

\* cited by examiner

*Primary Examiner*—David Nhu
(74) *Attorney, Agent, or Firm*—Blakely, Sokoloff, Taylor & Zafman LLP

(57) ABSTRACT

A method of forming a pre-patterned high-k dielectric film onto a support layer. The method includes: providing a support layer; providing a template defining template openings therein exhibiting a pattern that is a mirror image of a pattern of the pre-patterned high-k dielectric film; disposing the template onto the support layer; providing a high-k precursor material inside the template openings; curing the high-k precursor material inside the template openings to yield a cured film; and removing the template from the support layer after curing to leave the cured film on the conductive film.

30 Claims, 4 Drawing Sheets

METHOD OF PROVIDING A PRE-PATTERNED HIGH-K DIELECTRIC FILM

FIELD OF THE INVENTION

Embodiments of the present invention relate generally to methods of providing patterned dielectric films, such as dielectric films adapted to be used in thin film capacitors (TFC's).

BACKGROUND OF THE INVENTION

The demand for increased mobility in consumer electronics is pressuring manufacturers to scale electronic technologies (e.g., semiconductor devices) to ever smaller dimensions. At the same time, the demand for increased functionality, speed, noise elimination, etc., is forcing manufactures to increase the number of passive components (e.g., capacitors and resistors) used by consumer electronic devices. Passive component integration has traditionally been accomplished by mounting them onto package and/or printed circuit board (PCB) substrate surfaces. Restricting the location of the passive components to the substrate's surface however can limit the passive components' operational capabilities (due to their inherent distance from the semiconductor device) and the substrate's scalability.

One way manufacturers are attempting to address this is by embedding the passive components in the substrate, a technique referred to as embedded passive technology. This frees up surface real estate and facilitates substrate miniaturization. Speed and signal integrity also improves because embedded components provide a more direct path through which the IC signals propagate.

One particular area of interest with respect to embedded passive technology has been the incorporation of TFC's into organic packaging (e.g., bismaleimide triazine resin, etc.) substrates. It is desirable to provide decoupling capacitance in a close proximity to an integrated circuit chip or die. The need for such capacitance increases as the switching speed and current requirements of chips or dies becomes higher. Among the various materials being considered for use as capacitor dielectrics are high-k ceramic materials. However, high-k ceramic materials can require processing at high temperatures (e.g., furnace annealing at 600-800 degrees Celsius) in order to achieve their high dielectric constant properties. At these temperatures, organic packaging substrates can melt.

One technique for addressing this involves mounting a pre-fabricated TFC laminate that has already been annealed onto the organic substrate. Such TFC laminates may include a high-k dielectric material superimposed between two conductive films which will serve, respectively, as the top and bottom electrode structures of the TFC laminate. Typically, the bottom of the conductive films has already been patterned according to the pattern of the bottom electrode structure. Such a laminate is, according to the prior art, mounted onto a microelectronic substrate which may include polymer build-up layers and conductive build-up layers, the conductive build-up layers connecting with additional underlying conductive structures. After mounting of the TFC laminate, the top conductive film may be patterned to form the upper electrode. Then, via openings are formed through the high-k ceramic material, the polymer build-up layers, and, in some cases, portions of the lower electrode structures.

In some instances, the high-k dielectric film may be pre-patterned as part of the pre-fabricated TFC laminate before the laminate is mounted onto a microelectronic substrate. Pre-patterning of the high-k film is typically performed in order to take away high-k material from the path of the vias to be provided in the TFC laminate. One prior art method of pre-patterning the high-k dielectric material includes spray-coating a high-k dielectric material, such as, for example, barium strontium titanate or BST onto a nickel substrate, which substrate will, typically after mounting onto a substrate, be patterned to serve as the TFC top electrode. The BST film is then sintered and, after sintering, patterned using either an etch process or drilling.

The spray coating process mentioned above disadvantageously poses challenges in producing a uniform high-k firm over the nickel layer. Moreover, drilling or etching a high-k ceramic film as proposed by the prior art can take a long time, reducing manufacturing through-put. In addition, patterning using the etch process or drilling can introduce damage to the high-k dielectric layer and thereby impact the functionality of the resulting TFC.

Figure 1:
FIGS. 1-5 illustrate cross-sectional views showing formation of a patterned high-k dielectric layer on a TFC according to an embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an embedded passive structure and its method of formation are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a thin film laminate for use in the fabrication of embedded passives and its method of formation are disclosed. In one embodiment, the formation of embedded passive structures using a thin film laminate mounted on a substrate is disclosed. Aspects of these and other embodiments will be discussed herein with respect to FIGS. 1-12, below. The figures, however, should not be taken to be limiting, as they are intended for the purpose of explanation and understanding.

FIGS. 1-12 show stages illustrating a method of formation of a microelectronic package including a thin film laminate, such as for example, thin film capacitors (TFC's), and a packaging substrate, a PCB substrate, or the like, into which the TFC is embedded. More specifically, FIGS. 1-12 illustrate a formation of a microelectronic package in which the TFC is provided with a pre-patterned high-k dielectric film. In particular, FIGS. 1-5 depict an embodiment of a method of providing a pre-patterned high-k dielectric film. The term "microelectronic substrate" or "substrate" as used herein, is intended to encompass any type of packaging substrate, PCB substrate, etc., which can be used to accommodate embedded passive components. While FIGS. 1-12 depict a method embodiment where the pre-patterned high-k dielectric film is formed for use as part of a TFC laminate, embodiments are not so limited, and comprise within their scope the formation of a pre-patterned high-k dielectric film onto a support layer for microelectronic structures other than a TFC laminate.

In FIG. 1 by way of example, a method embodiment comprise providing a support layer for the pre-patterned high-k dielectric film in the form of a conductive film, such as conductive film 106 shown in cross-section. Conductive film 106 is, in the shown embodiment, adapted to serve as the top electrode of a TFC laminate as will be explained in further detail below. Typically, the conductive films 106 may include a metal material, such as copper, nickel, platinum or the like. In one embodiment, the conductive film 106 comprises a copper film having a thickness of about 30 microns.

Referring next to FIGS. 2-5 by way of example, a method embodiment comprises providing a pre-patterned high-k dielectric film onto a conductive film, such as conductive film 106 of FIG. 1. Various stages of providing the pre-patterned high-k dielectric film according to an embodiment will be explained in further detail in relation to FIGS. 2-5 below.

Figure 2:
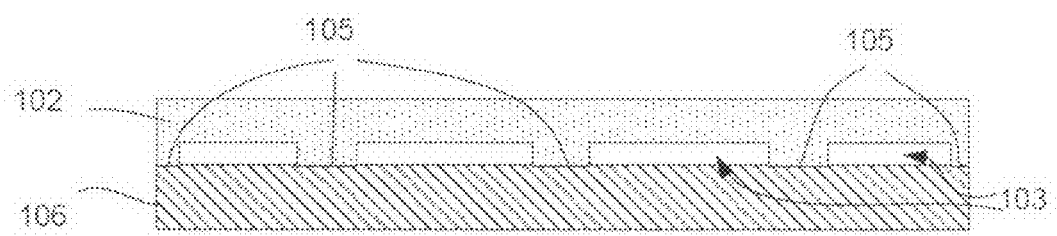

Referring first to FIG. 2 by way of example, a method embodiment comprises providing a template onto the conductive film 106. As shown in FIG. 2, according to an embodiment, a template 102 may be disposed onto conductive film 106, the template 102 defining template openings 103 therein exhibiting a pattern that is a mirror image of a pattern of the pre-patterned high-k dielectric film to be provided onto the conductive film 106. According to a preferred embodiment, the template 102 is adapted to be used in soft lithography to form the pre-patterned high-k dielectric film as will be explained in further detail below. Thus, the template 102 is preferably made of an elastomeric material, such as, most preferably, elastomeric polydimethylsiloxane (PDMS). Disposing the template 102 onto conductive film 106 may comprise, for example, pressing the template 102 onto the conductive film 106 such that surfaces 105 of the template 102 adapted to contact the conductive film 106 are substantially conformally placed onto the conductive film 106. In general, an embodiment contemplates the use of a template such as template 102 which is made of a material that is soft enough to substantially conform to a surface of the conductive film 106 upon pressing the template onto the film as described above without damaging the film, yet a material that is not too soft to have its feature shapes and sizes (i.e. shapes and sizes of the template openings 103) appreciably affected by such pressing. The template 102 may be formed according to any number of well known methods for forming such templates, such as soft templates. According to one embodiment, the template 102 may be made using lithography, such as, for example traditional lithography or even soft lithography, onto a template layer comprising a material of the template in order to define the openings 103 therein. According to another embodiment, the template 102 may be formed using molding, such as, for example, by providing a mold cavity (not shown), by filling the mold cavity with a precursor of the template material, and thereafter by curing the precursor to yield the template 102 in a well known manner. According to an embodiment, the template may be made of a material that allows the provision of template openings therein having small enough feature sizes for the forming of a pre-patterned high-k dielectric film therefrom, such as, for example, features sizes greater than or equal to 1 micron, although other feature sizes, such as, for example, feature sizes as low as 30 nm, are within the purview of embodiments. According to one embodiment, surfaces 105 of template 102 may be treated in order to facilitate a subsequent removal of template 102 from conductive film 106. According to an embodiment, for example, surfaces 105 of template 102 may be sprayed with a release material, such as, for example, Teflon. According to an alternative embodiment, for example, surfaces 105 of template 102 may undergo a modification of a chemical composition thereof, such as, for example, by way of plasma treatment of surfaces 105, in order to facilitate a removal of the template 102 from conductive film 106. When the template 102 is made of, for example, a polymer, plasma treatment of surfaces 105 may be effected for example in order to reduce a wettability of the same in a well known manner. Plasma treatment may, for example, include a substitution of hydrogen with fluorine using CF4 to change the properties of the surfaces 105.

Figure 3:
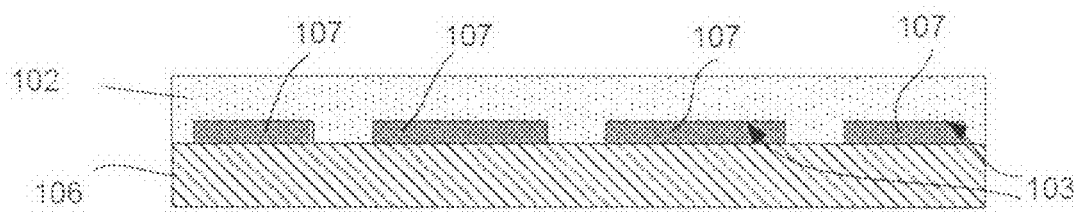

Referring next to FIG. 3 by way of example, an embodiment comprises providing a high-k precursor material 107 inside the template openings, such as openings 103 of template 102. According to a preferred embodiment, the high-k precursor material comprises a sol gel high-k precursor material. As used herein, a "high-k precursor film" or "high-k precursor material" refers to a precursor film or material that is not necessarily high-k, but that is adapted to develop high-k properties upon further processing. According to a preferred embodiment, the sol gel high-k precursor material 107 may be provided inside openings 103 by way of capillary action, after the template 102 has been disposed onto the conductive film 106 as shown in FIG. 2. According to another embodiment (not shown), the sol gel high-k precursor material 107 may be provided inside openings 103 prior to a disposition of the template 102 onto the conductive film 106. According to yet another embodiment, a layer of the sol gel high-k precursor material 107 may first be provided onto the conductive film 106, such as, for example, using a spin-on or spray-on process, and, thereafter, the template 102 disposed onto the conductive film 106 by being pressed thereon in such as way as to push the sol gel high-k precursor material 107 to fill the openings 103 of template 102. Optionally, after the formation of the pre-patterned high-k dielectric film, any portions of high-k material possibly existing on the conductive film 106 at a location of surfaces 105 could, for example, be etched back to remove any unwanted high-k regions on the conductive film 106.

Figure 4:
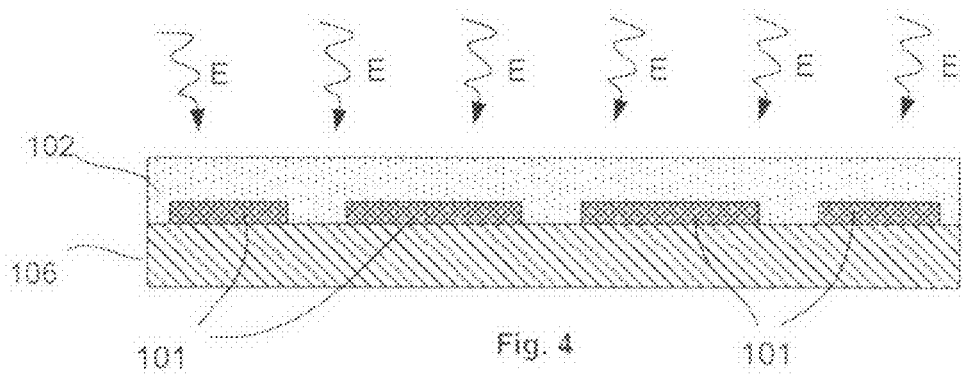
Figure 5:
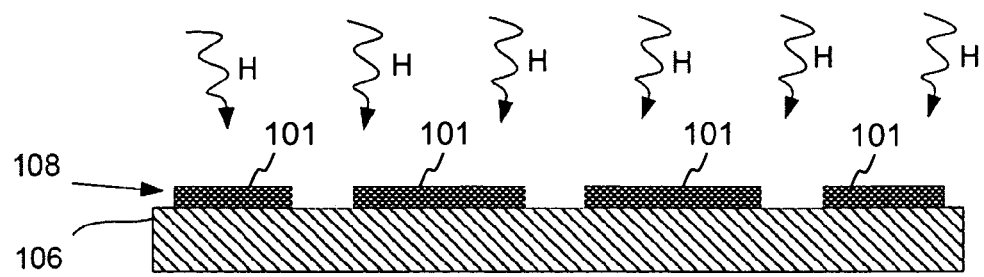

Referring now to FIG. 4 by way of example, a method embodiment comprises curing the high-k precursor material 107 inside the template openings 103 after disposing the template 102 onto the conductive film 106 to yield a cured film 101. A curing of the high-k precursor material 107 according to one embodiment may include, for example, heating the high-k precursor material 107, for example within a temperature range from about 80 degrees Celsius to about 300 degrees Celsius in a well known manner. According to another embodiment, a curing of the high-k precursor material 107 may include, for example, exposing the high-k precursor material 107 to light in a predetermined wavelength range, such as, for example, to UV light, in a well known manner. In the latter case, the template 102 may comprise a material that is transparent to the predetermined wavelength range of the curing light, such as, for example, to UV light, in order to allow a curing of the high-k precursor material 107 in the openings 103. For example, the template 102 may be made of a transparent elastomeric material, such as, for example, transparent PDMS. FIG. 4 depicts either a heating or a light exposure of the high-k precursor material 107 by way of meandering arrows marked E for either heat energy or light energy as shown. According to one embodiment, the cured film 101 is the pre-patterned high-k dielectric film 108 (see FIG. 5), in that the cured film 101 in that case would not require further processing, such as sintering, for example, to yield the pre-patterned high-k dielectric film. According to an alternative embodiment (corresponding to the embodiment shown in the figures), the cured film 101 is a cured high-k precursor film, in that the cured film 101 would require further processing, such as by way of sintering as shown in FIG. 5, in order to yield the pre-patterned high-k dielectric film 108. After the cured film 101 is obtained, the template 102 may be removed from the conductive film 106 in order to leave the cured film 101 on the conductive film 106. Optionally, especially where the cured film 101 is still in an amorphous gel form and contains additional unwanted moisture, prior to any sintering as will be explained below in relation to FIG. 5, the cured film 101 may be further cured after removal of the template 102 from the conductive film 106 in order to further dry the same.

Referring then to FIG. 5 by way of example, a method embodiment comprises sintering the cured film 101 by applying heat as shown by arrows H in order to yield the pre-patterned high-k dielectric film 108 on the conductive film 106. Sintering may involve heating the cured film 101, for example at a temperature of about 1000 degrees Celsius in a well known manner. Sintering produces the pre-patterned high-k dielectric film 108 as shown, including pre-patterned openings therein. The pre-patterned high-k dielectric film 108 may comprise a film made of barium strontium titanate (BST) and having a thickness of about 0.4 to about 1.5 microns. However, any number of materials may make up the high-k ceramic film, such as, for example, barium titanate (BaTiO3), strontium titanate (SrTiO3), barium strontium titanate (BaSrTiO3), or the like.

Figure 6:
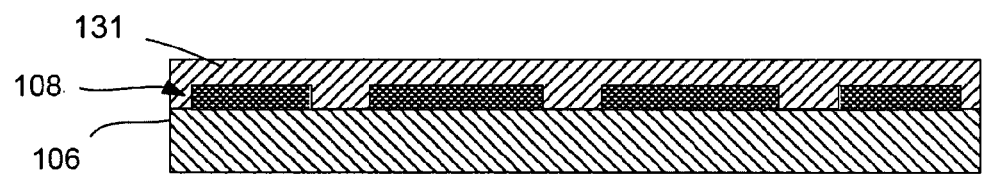
FIGS. 6-11 illustrate cross-sectional views showing an embedding of the TFC of FIG. 5 onto a substrate and subsequent via formation according to an embodiment.
Figure 7:
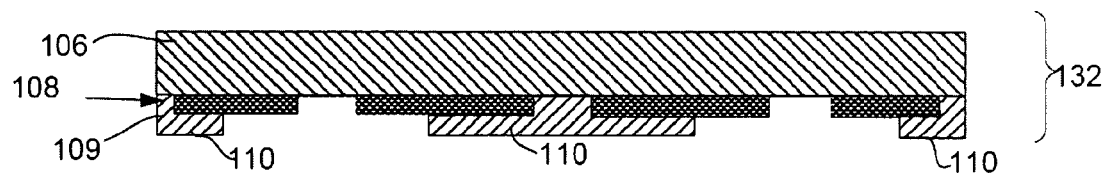

Referring next to FIGS. 6 and 7 by way of example, a method embodiment comprises providing a first electrode layer 109 including first conductive portions 110 onto the pre-patterned high-k dielectric film 108. As seen in FIG. 6, providing the first electrode layer 109 may involve first providing a conductive layer 131 onto the pre-patterned high-k dielectric film 108 and conductive film 106 such that parts of the conductive layer 131 fill the pre-patterned openings of pre-patterned high-k dielectric film 108 as shown. The conductive layer 131 may, similar to conductive film 106, include a metal material comprising, for example, copper, nickel, platinum or the like. The conductive layer 131 may be provided using, by way of example, a PVD process, combination PVD and electroplating or electroless plating processes, or the like. Referring next to FIG. 7, a cross-sectional view is shown of the structure of FIG. 1 after patterning of the conductive layer 131 to yield a bottom electrode structure or layer 109 including the remaining bottom conductive film portions 110 to yield a partially patterned TFC laminate 132. TFC laminate 132 is designated herein as being "partially patterned" since it may be further patterned as suggested for example by a method embodiment the stages of which are shown in FIGS. 8-11. A patterning of the conductive layer 131 may be effected using conventional photolithography and etching, as would be within the knowledge of one skilled in the art.

Figure 8:
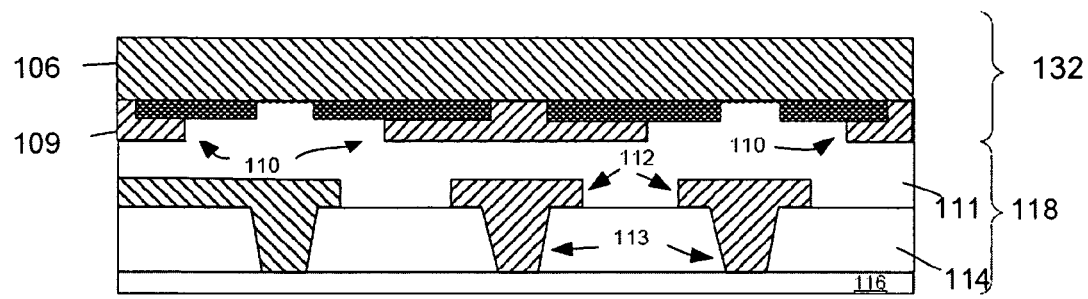

Turning now to FIG. 8, a cross-sectional view is shown of the structure of FIG. 7 after its having been mounted onto a microelectronic substrate 118 that includes polymer build-up layers 111, 114, and conductive build-up layers including interconnects 112 and vias 113 as shown. The interconnects 112 and vias 113 connect with underlying conductive structures (not shown). The partially patterned TFC laminate 132 may be mounted such that the bottom electrode structure 109 contacts the substrate as shown. The polymer build-up layers 111 and 114 may be formed, for example, using a dielectric material, such as an Ajinomoto Build-up Film (ABF). The interconnects and vias may be formed, for example, using copper. The use and formation of build-up layers is known to one of ordinary skill. Underlying the vias 113 and build-up polymer film 114 is layer 116, which may include an organic core material as know to one of ordinary skill, and/or additional polymer and conductive build-up layers. To improve adhesion between the partially patterned TFC laminate 132 and the substrate 118, the partially patterned TFC laminate 132 and substrate 118 can be joined after roughening the conductive portions 110 and prior to curing the build-up layer 111. The conductive regions 110 can be roughened using chemical etching, sputter etching, and/or like processes. One of ordinary skill appreciates that the fragile nature of the partially patterned TFC laminate 132 and its relative alignment to the underlying substrate 118 can be important considerations with respect to mounting the partially patterned TFC laminate 132 onto the substrate 118.

Figure 9:
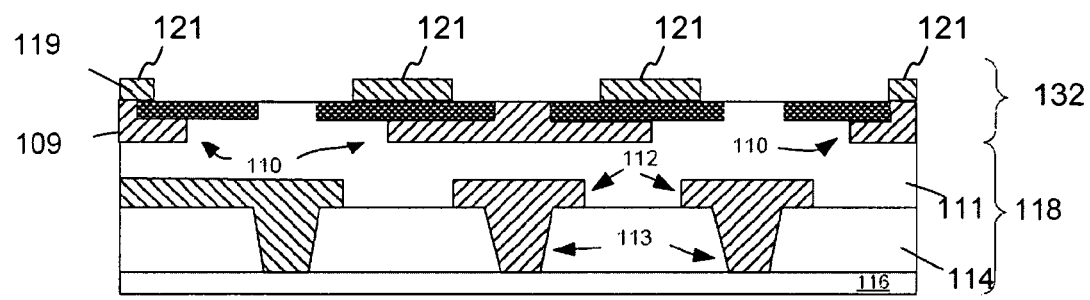

Next, referring to FIG. 9, the conductive film 106 is thinned and then patterned to form an intermediate top electrode layer 119 including top intermediate electrode portions 121. Layer 119 and electrode portions 121 are referred to herein as "intermediate" since they do not constitute the top electrode layer and the top electrodes proper, but rather represent intermediate structures in a process of forming the top electrode layer and top electrodes, as will become apparent hereinafter. Thinning may be accomplished using, for instance, a wet etch process, a dry etch process, a polishing process, combinations thereof, or the like. In an embodiment where the conductive film 106 is made of nickel, thinning may be accomplished by way of etching with a wet etchant, such as ferric chloride (FeCl3) prior to patterning. In one embodiment, the conductive film 106 may be thinned to between about 10 to about 20 microns to yield the intermediate top electrode layer 119. Thinning facilitates a patterning of intermediate top electrode layer 119 by reducing the amount of conductive material that must be removed. Thinning at this point in the processes may be advantageous because, during earlier stages of the partially patterned TFC laminate 132 fabrication, the thicker conductive film 106 is stronger and less susceptible to physical/chemical damage during formation of the capacitor dielectric and bottom electrode structures. After thinning, the conductive film 106 may be patterned with resist and then etched to define the intermediate top electrode layer 119. Etching may be accomplished using wet or dry etch processes. In one embodiment, the thinned conductive film 106 may be etched using a ferric chloride solution to yield the intermediate top electrode layer 119.

Figure 10:
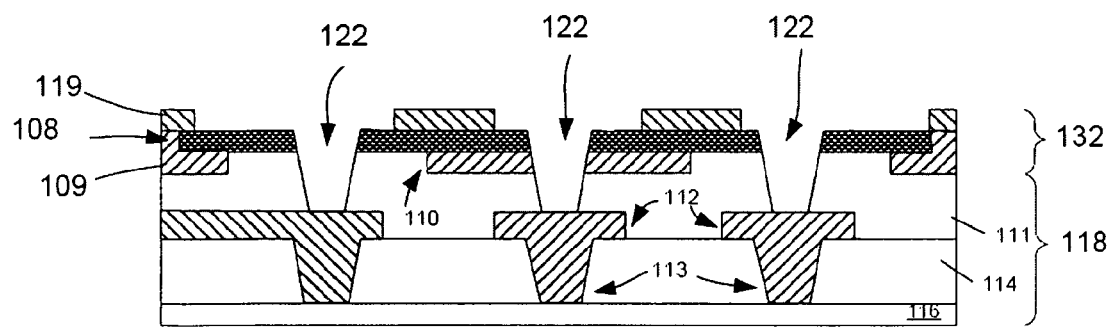

Next, shown in FIG. 10, the substrate is patterned to define via openings 122 through the partially patterned TFC laminate 132 and the polymer build-up layer 111, and in some cases, through portions of the bottom electrode portions 110. The via openings may be provided to expose underlying portions of the conductive build-up layers of the substrate including interconnects 112 as shown. The via openings 122 may be patterned using, for instance, a laser drilling process using a UV YAG laser or a CO2 laser, or a conventional photolithography/etch patterning process, or the like. In the shown embodiment of FIG. 10, providing the via openings 122 involves removal of a relatively small amount of the material of the pre-patterned high-k dielectric film 108 as shown. Some removal of the material of the pre-patterned high-k dielectric film 108 may be necessary according to an embodiment especially where alignment of patterned openings 122 in the pre-patterned high-k dielectric film 108 onto the underlying substrate 118 may not be accurate enough to match an exact location of the via openings 122 to be provided. However, embodiments include within their scope the provision of a pre-patterned high-k dielectric film patterned and disposed onto the underlying substrate 118 such that the provision of via openings through the partially patterned TFC laminate would not require any removal of the material of the pre-patterned high-k dielectric film. According to a preferred embodiment, any removal of the material of the pre-patterned high-k dielectric film 108 during a provision of the via openings 122 would be minimal.

Figure 11:
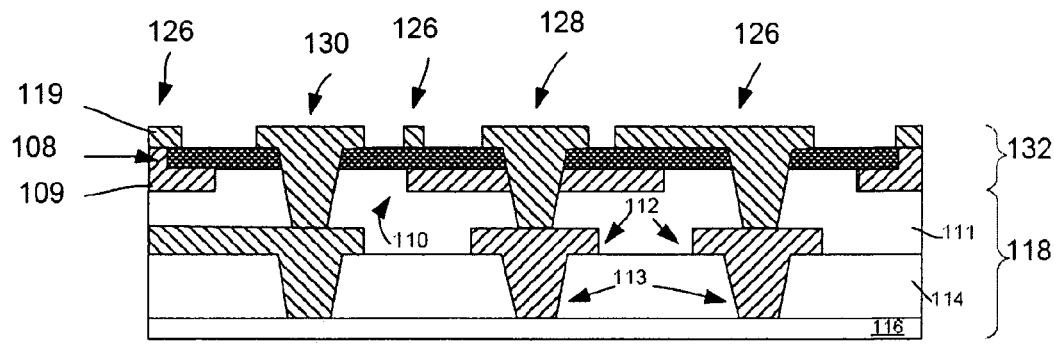
Figure 12:
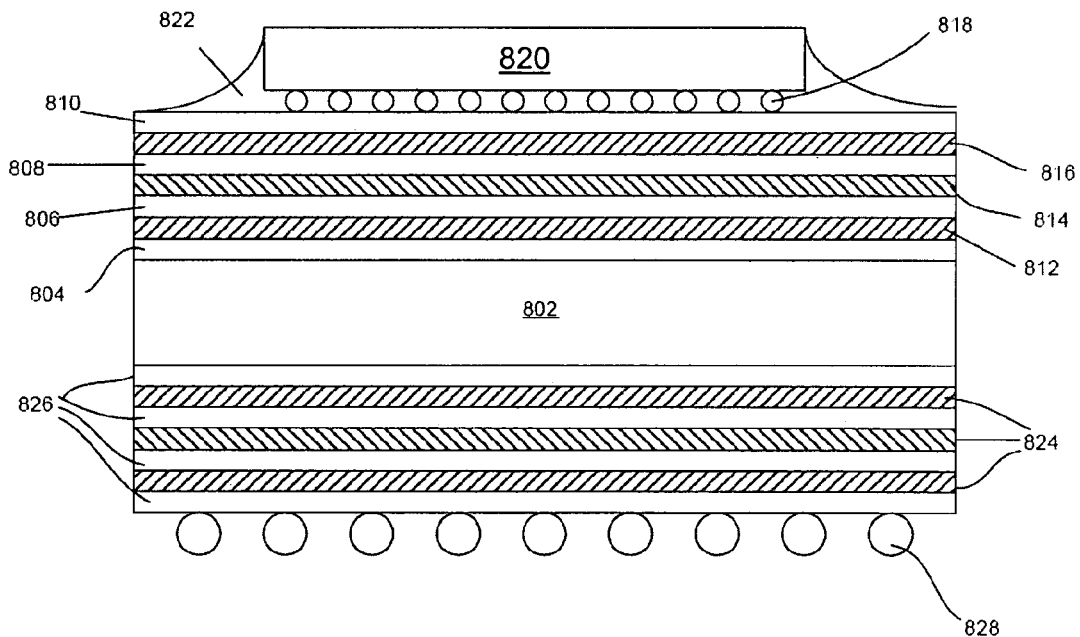
FIG. 12 illustrates a microelectronic package incorporating the embedded TFC of FIG. 11 according to one embodiment.

Referring next to FIG. 11, a conductive fill material is shown as having been deposited in via openings 122 and over the surface of the TFC where it may then be thinned and patterned according to conventional techniques in order to form top conductive structures including top electrode portions 126, biasing interconnects 128 for the bottom electrodes, I/O interconnects 130, build-up interconnect structures, and/or the like. Suitable materials for forming a conductive fill material inside via openings 122 and over the surface of the TFC may include copper, aluminum, or the like. According to one embodiment, the conductive fill material is deposited by first globally depositing a seed layer of copper, such as one having a thickness less than about one micron, using an electroless plating or PVD process, followed by deposition of a full thickness copper material using an electroplating process. After provision of the conductive fill material, as noted above, it may be thinned and patterned to define the completely formed upper electrode and associated conductive structures as described. Thinning may be accomplished, for instance, using wet chemical etch process, a dry etch process, a chemical mechanical polishing process, and/or the like. Patterning may be accomplished using a conventional lithographic and etch patterning process, a lift-off process, or the like. One of ordinary skill will appreciate that other integration schemes for forming the top conductive structures could also include, for example, a complete removal of the conductive film 106 (instead of thinning and patterning to form partially defined top electrode layer structures) followed by a seed layer deposition, a full thickness conductive layer deposition, and patterning to define the conductive structures 126, 128 and 130. Embodiments of the present invention are not necessarily limited to only the formation of structures such as 126, 128 and 130. Any number of other interconnect features associated with the formation of build-up layer technology can be accommodated using one or more of the integration schemes disclosed herein.

Subsequent processing is considered conventional to one of ordinary skill. So, for example, referring to FIG. 12, which shows the relative positional relationships of conductive build-up layers 812, 814, 816, 824, polymer build-up layers 804, 806, 808, 810, 826, an organic core material 802, a semiconductor die 820, underfill material/fillets 822, die-to-package interconnects 818, and package-to-PCB interconnects 828, if TFC structures similar to one or more of those disclosed in FIGS. 1-11 were incorporated into, for instance, the conductive build-up layer 814 (TFC structures not shown), then additional conductive build-up layer 816 and polymer build-up layers 808 and 810 could additionally be formed overlying them using conventional methods. Following the formation of the desired number of build-up layers, the semiconductor die can be attached to the package substrate using conventional die attach reflow methods, bump interconnects 828 could be attached to the package substrate using conventional methods (e.g. ball grid array (BGA) reflow methods), and then the integrated package that includes the passive TFC's could be mounted to a PCB, a mother board, or the like, for use by the electronic device.

It is noted that, although the embodiments described above relate to the formation of a pre-patterned high-k dielectric film as part of a TFC laminate, embodiments are not so limited, and comprise within their scope the provision of a pre-patterned high-k dielectric film onto any support layer, as would be recognized by one skilled in the art. In addition, while embodiments disclosed herein teach the formation of embedded capacitors in a build-up layer of a packaging substrate, other passive structures, such as for example inductors, resistors, etc., can similarly be formed and/or accommodated using one or more of the embodiments disclosed herein. Also, these passive components can be formed in any number of substrate types that can accommodate the incorporation TFC laminates.

Advantageously according to some embodiments, unlike conventional TFC processing which exposes portions of the capacitor dielectric to a potentially damaging laser drilling or etch process while forming the via openings, here the problem has been overcome by selectively substantially limiting the formation of the via openings to the pre-patterned regions where there may be only a negligible amount of capacitor dielectric to damage. That is, problems associated with damaging the capacitor dielectric during the process of defining via openings are significantly reduced according to some embodiments because the capacitor dielectric has been strategically substantially removed from regions that can be exposed to etchants and/or the laser via drilling process. In addition, because there is no substantial dielectric layer portions that have to be removed during the formation of the via openings, conventional etch processes and/or lower power lasers (as opposed to the more expensive high-power laser drilling processes) can be used to form the via openings.

In addition, because the lower electrode layer, such as lower electrode layer 109 as seen in FIG. 9 for example, may also been pre-patterned according to an embodiment and conductive material removed from regions where vias are to be formed, laser drilling process and/or etch rate and etch uniformity during formation of the via opening can be improved. That is, according to an embodiment, by removing regions of lower electrode layer from locations where vias are to be formed, the type of material(s) which must be removed to form the via openings is more consistent from via-to-via across the substrate. This has the potential to reduce the amount of damage to underlying structures by reducing their overall time of exposure to the process that forms the via openings (i.e. overetch time can be reduced). In addition, it can also improve cycle time because obstructions (i.e., the portions of the lower electrode) which can impede the etch or laser ablation process have been removed.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming an embedded thin film capacitor comprising:
   providing a thin film capacitor laminate comprising:
      providing a pre-patterned high-k dielectric film onto a conductive film including:
         providing a template defining template openings therein exhibiting a pattern that is a mirror image of a pattern of the pre-patterned high-k dielectric film;
         disposing the template onto the conductive film;
         providing a high-k precursor material inside the template openings;
         curing the high-k precursor material inside the template openings to yield a cured film; and
         removing the template from the conductive film after curing to leave the cured film on the conductive film;
      providing a first electrode layer including first conductive portions onto the pre-patterned high-k dielectric film;
      patterning the conductive film to yield a second electrode layer including second conductive portions on the pre-patterned high-k dielectric film.

2. The method of claim 1, wherein curing comprises curing the high-k precursor material after disposing the template onto the conductive film.

3. The method of claim 2, wherein providing the pre-patterned high-k dielectric film comprises further curing the cured film after removing the template from the conductive film.

4. The method of claim 1, wherein providing the pre-patterned high-k dielectric film comprises sintering the cured film.

5. The method of claim 1, wherein the template comprises an elastomeric material.

6. The method of claim 5, wherein the template comprises PDMS.

7. The method of claim 1, wherein providing a template comprises:
   providing a template layer comprising a material of the template;
   using lithography to define the template openings in the template layer to yield the template.

8. The method of claim 1, wherein providing a template comprises:
   providing a mold cavity;
   providing a precursor of a material of the template in the mold cavity;
   curing the precursor to yield the template.

9. The method of claim 1, wherein providing the template comprising treating a surface of the template adapted to contact the conductive film to facilitate removing the template from the conductive film.

10. The method of claim 9, wherein treating comprises one of spraying the surface of the template with a release material and modifying a chemical composition of the surface.

11. The method of claim 1, wherein the high-k precursor material comprises a sol gel high-k precursor material.

12. The method of claim 11, wherein providing the high-k precursor material comprises, after disposing the template, filling the template openings with the sol gel high-k precursor material by way of capillary action.

13. The method of claim 11, wherein providing the high-k precursor material comprises:
   providing a layer of the sol gel high-k precursor material onto the conductive film; and
   disposing the template onto the conductive film after providing the layer of the sol gel high-k precursor material, disposing comprising pressing the template onto the conductive film such that the sol gel high-k precursor material fills the template openings.

14. The method of claim 1, wherein curing comprises heating the high-k precursor material.

15. The method of claim 1, wherein curing comprises exposing the high-k precursor material to light in a predetermined wavelength range, and wherein the template comprises a material transparent to the predetermined wavelength range.

16. The method of claim 1, wherein
   the first electrode layer is a bottom electrode layer;
   the first conductive portions are bottom conductive portions;
   the second electrode layer is a top electrode layer; and
   the second conductive portions are top conductive portions.

17. The method of claim 16, further comprising:
   providing a substrate including a polymer build-up layer and a conductive build-up layer;
   mounting the thin film capacitor laminate onto the polymer build-up layer of the substrate such that the bottom conductive portions are disposed between the polymer build-up layer and the pre-patterned high-k dielectric film.

18. The method of claim 17, further comprising:
   providing via openings extending through the thin film capacitor laminate and the polymer build-up layer of the substrate to the conductive build-up layer; and
   filling the via openings with conductive fill material to provide package vias.

19. The method of claim 18, wherein providing via openings comprises using a UV laser, a CO2 laser and lithography.

20. The method of claim 1, wherein patterning the conductive film comprises using lithography and one of a wet etch and a dry etch.

21. The method of claim 20, wherein patterning the conductive film comprises thinning the conductive film before using lithography using at least one of a wet etch, a dry etch and a polishing process.

22. The method of claim 18, wherein patterning the conductive film occurs after mounting and comprises:
   patterning the conductive film to obtain an intermediate top electrode layer; and
   after providing via openings, patterning the intermediate top electrode layer and portions of the conductive fill material disposed on the pre-patterned high-k dielectric film to obtain the top electrode layer.

23. The method of claim 1, wherein the pre-patterned high-k dielectric film comprises a material selected from a group consisting of strontium titinate, barium strontium titinate and/or barium titinate.

24. The method of claim 1, wherein each of the conductive film and the first electrode layer comprises at least one of copper, nickel and platinum.

25. The method of claim 22, further comprising patterning portions of the conductive fill material disposed above the pre-patterned high-k dielectric film to form interconnects on the pre-patterned high-k dielectric layer.

26. The method of claim 18, wherein filling the via openings comprises:
   using one of an electroless plating process and a PVD process to deposit a seed conductive layer; and using an electroplating process to deposit a remaining portion of the conductive fill material to fill the package via openings.

27. A method of forming a pre-patterned high-k dielectric film onto a support layer comprising:

providing a support layer;

providing a template defining template openings therein exhibiting a pattern that is a mirror image of a pattern of the pre-patterned high-k dielectric film;

disposing the template onto the support layer;

providing a high-k precursor material inside the template openings;

curing the high-k precursor material inside the template openings to yield a cured film; and removing the template from the support layer after curing to leave the cured film on the support layer.

28. The method of claim 27, wherein providing the pre-patterned high-k dielectric film comprises sintering the cured film.

29. The method of claim 27, wherein the template comprises an elastomeric material.

30. The method of claim 27, wherein the template comprises PDMS.

* * * * *